United States Patent [19]
Reedy

[11] Patent Number: 4,649,624
[45] Date of Patent: Mar. 17, 1987

[54] FABRICATION OF SEMICONDUCTOR DEVICES IN RECRYSTALLIZED SEMICONDUCTOR FILMS ON ELECTROOPTIC SUBSTRATES

[75] Inventor: Ronald E. Reedy, San Diego, Calif.

[73] Assignee: The United States of America as represented by the Secretary of the Navy, Washington, D.C.

[21] Appl. No.: 538,461

[22] Filed: Oct. 3, 1983

[51] Int. Cl.$^4$ .............................................. H01L 21/42
[52] U.S. Cl. .................................. 29/571; 29/569 L; 29/576 C; 148/DIG. 93; 148/DIG. 94; 148/DIG. 164
[58] Field of Search ............... 350/96.11, 96.12, 96.13, 350/96.14; 148/DIG. 164, DIG. 93, DIG. 94; 29/571, 569 L, 576 C; 357/19

[56] References Cited

U.S. PATENT DOCUMENTS

| 4,021,834 | 5/1977 | Epstein et al. | 350/96.12 |
| 4,220,395 | 9/1980 | Wang et al. | 350/96.12 |
| 4,360,246 | 11/1982 | Figueroa | 350/96.12 |

OTHER PUBLICATIONS

Tien, P. K., Giordmaine, J. A., "Building the Integrated Optical Circuit", Optical Spectra., Jun. 1981.
Alferness, R. C., Bohl, L. L., Divino, M. D., "Low Loss Fibre Coupled Waveguide Directional Coupler Modulator", Electronic Letters, 18, 12, 1982.
Douglas, J. H., "Route to 3-D Chips", High Technology, Sep., 1983.
Miller, R. C., Savage, A., "Temperature Dependence of the Optical Properties of Ferroelectric LiNbO$_3$ and LiTaO$_3$", Applied Physics Letters, 9, 4, Aug. 1966.

Primary Examiner—Brian E. Hearn
Assistant Examiner—John T. Callahan
Attorney, Agent, or Firm—Robert F. Beers; Ervin F. Johnston; Harvey Fendelman

[57] ABSTRACT

This invention relates to a process of manufacturing an integrated structure in which optical signals can be processed in an electrooptic material such as lithium tantalate and electrical signals can be processed in a semiconductor material such as silicon. Microelectronic semiconductors are fabricated in the semiconductor material and electrooptic devices are fabricated in the electrooptic material. Devices made by the process of the present invention are also disclosed.

13 Claims, 8 Drawing Figures $P_d$ = LASER POWER TO DAMAGE SUBSTRATE
$P_m$ = LASER POWER TO INITIATE SILICON MELTING

FABRICATION OF SEMICONDUCTOR DEVICES IN RECRYSTALLIZED SEMICONDUCTOR FILMS ON ELECTROOPTIC SUBSTRATES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of integrated circuit devices and, more particularly, to the fields of integrated circuit semiconductor devices and Integrated Optical Circuits (IOC).

Integrated Optical Circuits (IOC) have received considerable attention in the literature due to their potential for high speed signal handling and signal processing capabilities. The basic functions of IOC are to control and detect guided light. Integrated optical devices are typically fabricated in materials that exhibit special optical properties such as photoconductivity, electrooptic or acoustooptic effects. Dielectric waveguides, which are the fundamental component of most IOC devices, consist of regions of high index of refraction surrounded by regions of lower index of refraction, thereby propagating light which wave launched down the waveguide.

Each IOC function can be performed best in a material specifically suited for that function. For example, lithium niobate has exhibited modulation bandwidths in excess of 5 GHz, and has been used in an optical spectrum analyzer, and in a one-dimensional spatial light modulator. Low loss waveguides have been fabricated in lithium tantalate and complex IOC functions have been demonstrated in lithium niobate such as an optically activated half adder which used channel waveguide modulators and cadmium sulfide films. This circuit demonstrated that complex functions can be performed by IOC, and would be of significant value if the potential speed of the electrooptic material could be realized by the entire circuit. However, the potentially high speed operation of the electrooptic materials has not been fully utilized due to the difficulty of interfacing between the optical regime and the electronic regime. That is, the integrated detectors were much slower than the modulators used in the IOC devices.

Schemes for detection of light in LiNbO$_3$ substrates have been demonstrated, and they fall into two broad categories: discrete detectors that must be attached to the IOC, and integrated detectors. Discrete detectors are often high performance silicon photodetectors, (e.g. avalanche photodiode or p-i-n photodiode), but the discrete nature of the components makes the alignment of the electrooptic substrate to the photodetector cumbersome and difficult and the optical coupling obtained is not maximized. Furthermore, the combined structure has potential reliability problems and is not suitable for mass production. Integrated structures have been made using photoconductive materials that could be deposited onto the substrate, such as polycrystalline cadmium sulfide (CdS). Although CdS has a large light-to-dark resistance ratio, it is limited to operation below about 20 KHz. This has been sufficient to demonstrate many IOC operations, but is not fast enough to be of much practical value.

SUMMARY OF THE INVENTION

In accordance with the present invention a process for fabrication of an integrated optical circuit is described in which optical signals can be processed in an electrooptic material such as lithium tantalate and electrical signals can be processed in a semiconductor material such as silicon. The structures so formed are compatible with standard silicon processing to allow fabrication of microelectronic circuitry in the semiconductor layer and to allow fabrication of electrooptic devices such as optical modulators in the electrooptic material substrate of the integrated device structure.

In accordance with the present invention, the structure is fabricated by depositing thin polycrystalline silicon, or other semiconductor, films onto lithium tantalate, or other electrooptic material, substrates, with an intervening silicon dioxide, or other transparent thermal insulator, layer. The structure is then irradiated with the energy from a focused energy beam such as a CW argon ion laser to promote melting and recrystallization of the semiconductor layer, thereby increasing the grain size of the crystallites of the semiconductor layer to up to several tens of micrometers or greater. The structures so fabricated can then be used to subsequently fabricate electronic devices in the semiconductor films and electrooptical devices in the underlying electrooptic material substrate. Critical parameters for this invention are the thickness of the semiconductor film and the intervening insulator layer and the characteristics of the scanning energy beam. Further, in accordance with the present invention a process is described for melting and recrystallizing the semiconductor film without damaging the underlying substrate.

Devices created in accordance with the present invention have the capability of handling both electronic and optical signals in a single substrate structure. Devices fabricated in accordance with the present invention exhibit increased reliability, easier fabrication, potentially increased system speed, and potentially new applications and/or functions based on the interaction of electronic and electrooptic devices.

OBJECTS OF THE INVENTION

Accordingly, it is the primary object of the present invention to disclose an integrated structure in which electrical and optical signals can be processed in an integrated structure comprising an electrooptic material, and a semiconducting material.

It is a further object of the present invention to disclose a novel process for making silicon on electrooptic substrate devices.

It is a further object of the present invention to disclose a novel process for generating device quality silicon films on lithium tantalate substrates.

It is a still further object of the present invention to disclose a technique of recrystallizing semiconductor films on electrooptic substrate without damaging the electrooptic substrates.

It is a further object of the present invention to disclose an integrated optic circuit which contains both electrooptic devices and microelectronic integrated circuitry in a common substrate.

Other objects, advantages and novel features of the invention will become apparent from the following detailed description of the invention when considered in conjunction with the accompanying drawings.

DESCRIPTION OF THE PREFERRED EMBODIMENT

Figure 1:
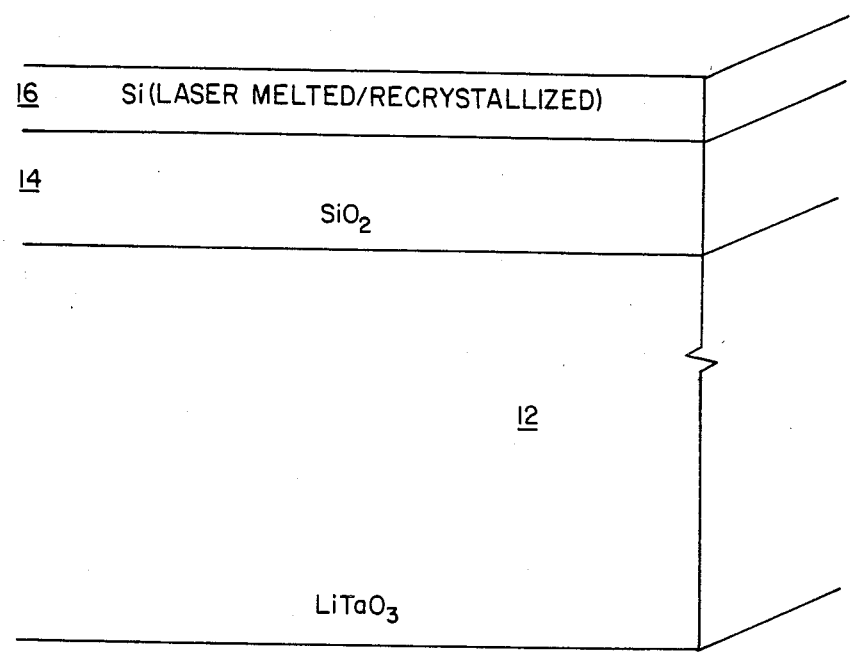
FIG. 1 is a schematic side view of a portion of a silicon on electrooptic substrate (SOES) structure in accordance with the present invention.

As has been stated above, the present invention relates to the formation of a semiconductor device in a layer of semiconductor material formed on top of an insulator material which has been deposited upon an electrooptic substrate. The electrooptic substrate has an electrooptic device formed in it whereby the electrooptic device and the semiconductor device are integrated into a single structure and can cooperate as an integrated device. The preparation sequence for the fabrication of semiconductor devices in semiconductor films formed on insulators which are in turn formed on electrooptic substrates will now be described with regard to FIG. 1. FIG. 1 illustrates an electrooptic substrate 12 which in the preferred embodiment of the present invention is comprised of lithium tantalate (LiTaO$_3$). The electrooptic substrate 12 may be Y-cut lithium tantalate with a SAW polish on the topside and an optical polish on the back side. Prior to any high temperature step, the electrooptic substrate 12 should be cleaned and rinsed as would be readily understood by one of ordinary skill in this art. Although it is to be understood that, in accordance with the present invention, an electrooptic device will be formed in the electrooptic substrate 12 and would be so formed by well-known techniques, the description of the formation of electrooptic devices in the substrate 12 will be deferred to a later portion of this disclosure. This portion of the disclosure will be concerned with the preparation of a semiconductor film on an electrooptic substrate and, more particularly, to the formation of a silicon film on an electrooptic substrate (SOES) and, more particularly, to the formation of a silicon film on a silicon dioxide insulator on a lithium tantalate substrate.

The silicon dioxide layer 14 is next deposited on the lithium tantalate 12 by known techniques as in an horizontal flow Chemical Vapor Deposition (CVD) system at a suitable temperature such as 665° C. and at a suitable deposition rate such as 0.05 μm/Min. by oxidation of 4% SiH$_4$ in argon, with O$_2$ present and N$_2$ as a carrier gas. By applicant's experiments it has been determined that SiO$_2$ is an effective barrier to lithium migration at the temperatures used in these process sequences. For enhancement of device quality, the SiO$_2$ layer may be deposited on both surfaces of the lithium tantalate substrate (SiO$_2$ not shown on the bottom surface of 12).

After the SiO$_2$ depositions on the surface(s) of the LiTaO$_3$ substrate 12, 0.5 μm of undoped polycrystalline silicon 16 is deposited by thermal decomposition of 15% SiH$_4$ in N$_2$ carrier gas at 675° C. at a deposition rate of 0.2 μm. It has been discovered that the silicon deposition step may cause a slight decrease in substrate transparency, as lithium tantalate darkens when heated in a non-oxidizing ambient. It has also been discovered that the presence of silicon dioxide on both surfaces of the substrate 12 mitigates this darkening effect. The absorption coefficient ($\lambda=0.488$ of μm) has been observed to increase from 0.59 per centimeter to 1.22 per centimeter as the result of the silicon deposition. It has also been discovered that reheating the substrate 12 sample at 875° C. in flowing nitrogen and oxygen for thirty minutes returns the substrate 12 to its original transparency. Following these steps the sample comprising the substrate 12, the SiO$_2$ layer 14 and the Si layer 16 is ready for laser melting of the Si layer 16 in order to increase the crystallite size of the silicon material 16.

For the application of laser energy to result in a silicon film 16 of device quality, the laser and material parameters must be such that the silicon film melts and recrystallizes into larger grain polycrystalline silicon which the underlying electrooptic substrate of lithium tantalate remains undamaged. It is to be understood at this point that although the present invention is described in its preferred embodiment as being comprised of a lithium tantalate substrate, a silicon dioxide thermal insulator and a silicon semiconductor layer, other materials may be utilized. For instance, lithium niobate may be used as the substrate material, other transparent thermal insulators may be used for the insulator layer 14 and other semiconductor materials such as germanium may be used in place of the silicon layer 16.

Applicant has discovered that a given temperature in the silicon film can be achieved with reduced laser power by increasing the substrate 12 temperature and/or lowering the scan speed of the laser annealing facility. Hence, by increasing the substrate 12 temperature and reducing the scan speed of the laser annealing facility (not shown) utilized to melt the silicon layer 16, the power from the laser required to melt a silicon film in an SOES structure can be reduced below the threshold damage power of the substrate 12.

Applicant has discovered that laser induced melting and recrystallization of the silicon film 12 without damaging the lithium tantalate substrate can be accomplished with scan speeds of the laser annealing facility in the 0.25–0.5 cm/sec range at a substrate 12 temperature of 425° C. A laser annealing facility suitable for melting the silicon layer 16 and recrystallizing same is commercially available for Coherent, Inc., Palo Alto, Calif. and comprising an argon ion laser facility.

Figure 2:
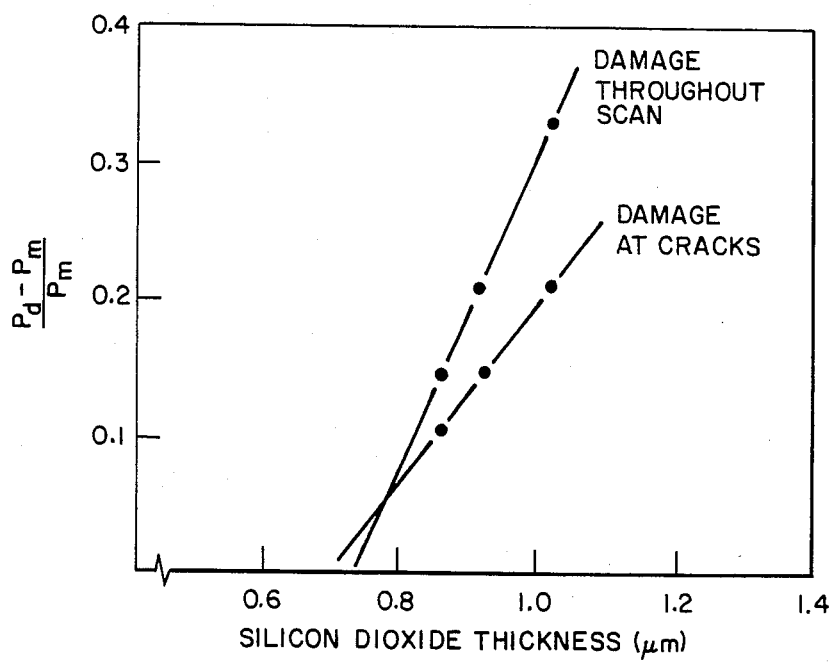
FIG. 2 is a graph of the effect of silicon dioxide thickness on laser power range requirements to melt a silicon layer on the silicon dioxide insulator without damage to the underlying electrooptic substrate.

Referring to FIG. 2 there is illustrated the effect of the thickness of the layer 14 of silicon dioxide on the laser power range required to melt the silicon layer 16 without damage to the underlying electrooptic substrate 12. The graph of FIG. 2 is a plot of the normalized laser power range between the onset of silicon melting, $P_m$ and the onset of substrate damage, $P_d$ (normalized to the former) vs. oxide thickness. For the conditions used, which were 0.5 m thick silicon, substrate temperature=425° C., laser beam spot size=50 micrometers and scan speed=0.25 cm/sec, $P_m$ was 0.33 watts (all lines argon ion laser). FIG. 2 shows that a minimum oxide thickness of 0.7 $\mu$m $SiO_2$ may be required to avoid substrate damage and that the onset of substrate damage may occur at a lower power in substrates that have surface cracks or scratches. It can be seen from FIG. 2 that as the $SiO_2$ layer thickness increases, laser power window increases due to the thermal insulation by the $SiO_2$. For example, with 1.0 $\mu$m $SiO_2$ on a polished sample, laser power between 0.33 and 0.40 watts melts the silicon 16 without damaging the substrate 12. It is also noted, but not shown in FIG. 2, that substrate 12 damage may be expected to occur at lower powers near a sample edge.

In accordance with the present invention, samples comprised of a lithium tantalate substrate 12, a silicon dioxide layer 14 and a silicon film 16 has been prepared for device fabrication with 1.4 $\mu$m thick $SiO_2$ and the silicon films were then laser melted as described above. It has been discovered that scan speeds between 2.0 cm/sec and 50.0 cm/sec have resulted in catastrophic substrate damage. The observation that scan speeds outside the range of 2.0-50.0 cm/sec resulted in silicon melting without substrate damage is believed to a key element to understanding the damage mechanism which is discussed more fully below.

Figure 3:
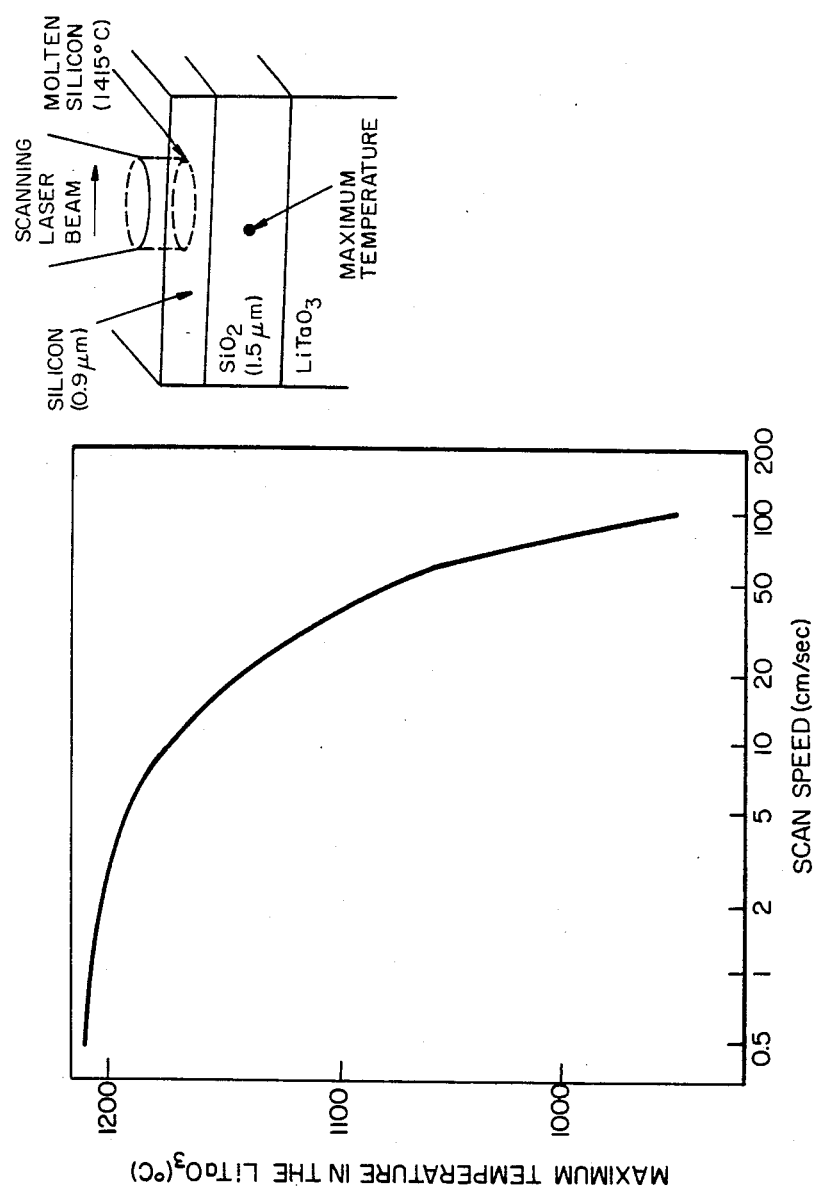
FIG. 3 is a graph of maximum substrate temperature vs. laser scan speed.
Figure 4:
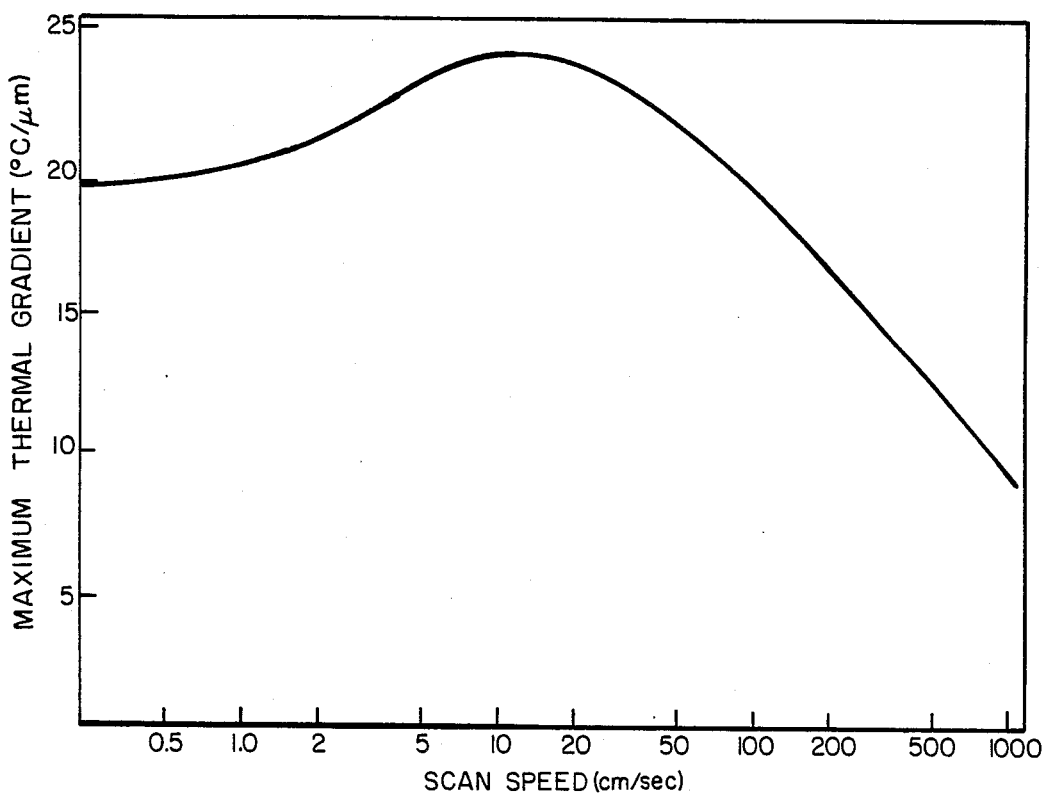
FIG. 4 is a graph of the maximum thermal gradient in a lithium tantalate substrate vs. scan speed.

Theoretical thermal profiles have been evaluated to explore the contribution of thermal effects to substrate 12 damage created during laser melting of the silicon films 16. It is believed that mechanisms other than thermal effects could contribute, including optical damage, phase transitions, acoustooptical or electrooptical interactions. Several factors, however, point to thermal effects as the damaging mechanism, including the following:

1. The damage threshold laser power was 4.5 watts for a bare lithium tantalate substrate, but was approximately 0.5 watts with a silicon film present. The silicon film reduces the amount of laser energy reaching the substrate, but dramatically increases the temperature;

2. The damage threshold laser power was reduced near sample edges and at substrate defects; and 3. The highly anisotropic thermal expansion coefficient of the substrate, FIG. 3 plots the maximum temperature and FIG. 4 plots the maximum thermal gradient at the $SiO_2$/LiTaO_3 interface vs. scan speed. As can be seen, the maximum temperature is a monotonically decreasing function of scan speed, which implies that maximum temperature is not a major cause of the substrate damage since low scan speeds which result in the highest temperatures, did not damage in applicant's experiments.

Figure 5:
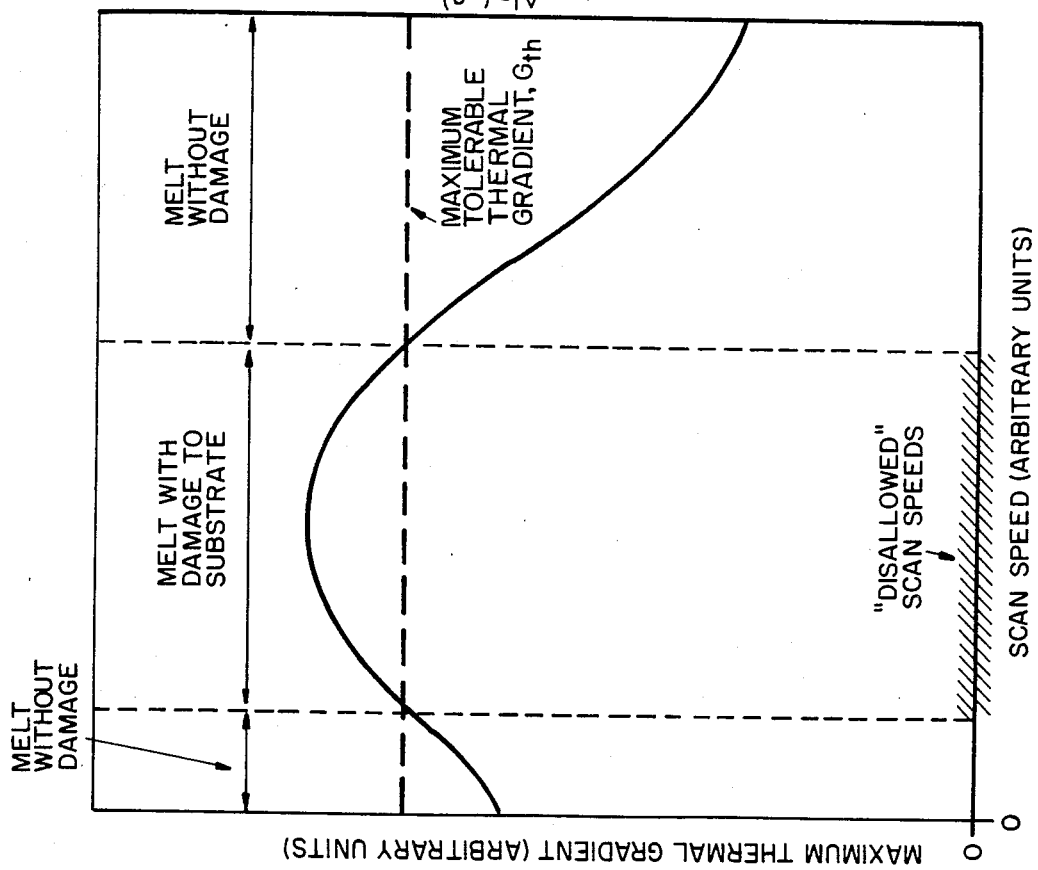
FIG. 5 is a graph of a theoretical explanation of observed intermediate ranges of laser scan speed that causes damage to lithium tantalate substrate during melting of silicon layers on silicon dioxide insulators deposited on the lithium tantalate substrate.

The theoretical and experimental data are consistent with maximum thermal gradient as the mechanism which causes, or at least initiates, the substrate damage. This opinion is based on the assumption that LiTaO_3 has a maximum thermal gradient above which it suffers damage, which, for purposes of this discussion, shall be called the threshold thermal gradient, $G_{th}$. If $G_{th}$ is greater than the zero velocity value of FIG. 4 but less than the maximum value, there will be two ranges of scan speeds for which melting would occur without substrate damage and a middle range of scan speeds which would cause damage (see FIG. 5). Scan speeds in the range of 2.0-50.0 cm/sec (for the conditions specified in FIG. 4) have been discovered to lead to substrate damage while scan speeds below 2.0 cm/sec or above approximately 50.0 cm/sec lead to melting without substrate damage. Applying these measured values to FIG. 4 yields an estimate of 21.0° C./$\mu$m for lithium tantalate's threshold gradient.

In accordance with an alternative approach to applicant's invention, these calculations can be used to estimate proper laser conditions for other materials. For example, available data indicates that the threshold thermal gradient for lithium niobate is approximately 56% of the value for lithium tantalate. Hence, for the same silicon and $SiO_2$ film thicknesses, FIG. 4 shows that a scan speed of about 800 cm/sec is necessary to avoid damaging a lithium niobate substrate while melting the silicon film. According to FIG. 3, the maximum temperature in the lithium niobate would be less than 800° C., well below the melting point of lithium niobate. These calculations could be repeated for thicker $SiO_2$ layers which would reduce the scan speed requirements. The choice of scan speed in $SiO_2$ film thicknesses would then be based on practical considerations such as deposition rate or maximum scan speed of the laser scanning system.

Figure 8:
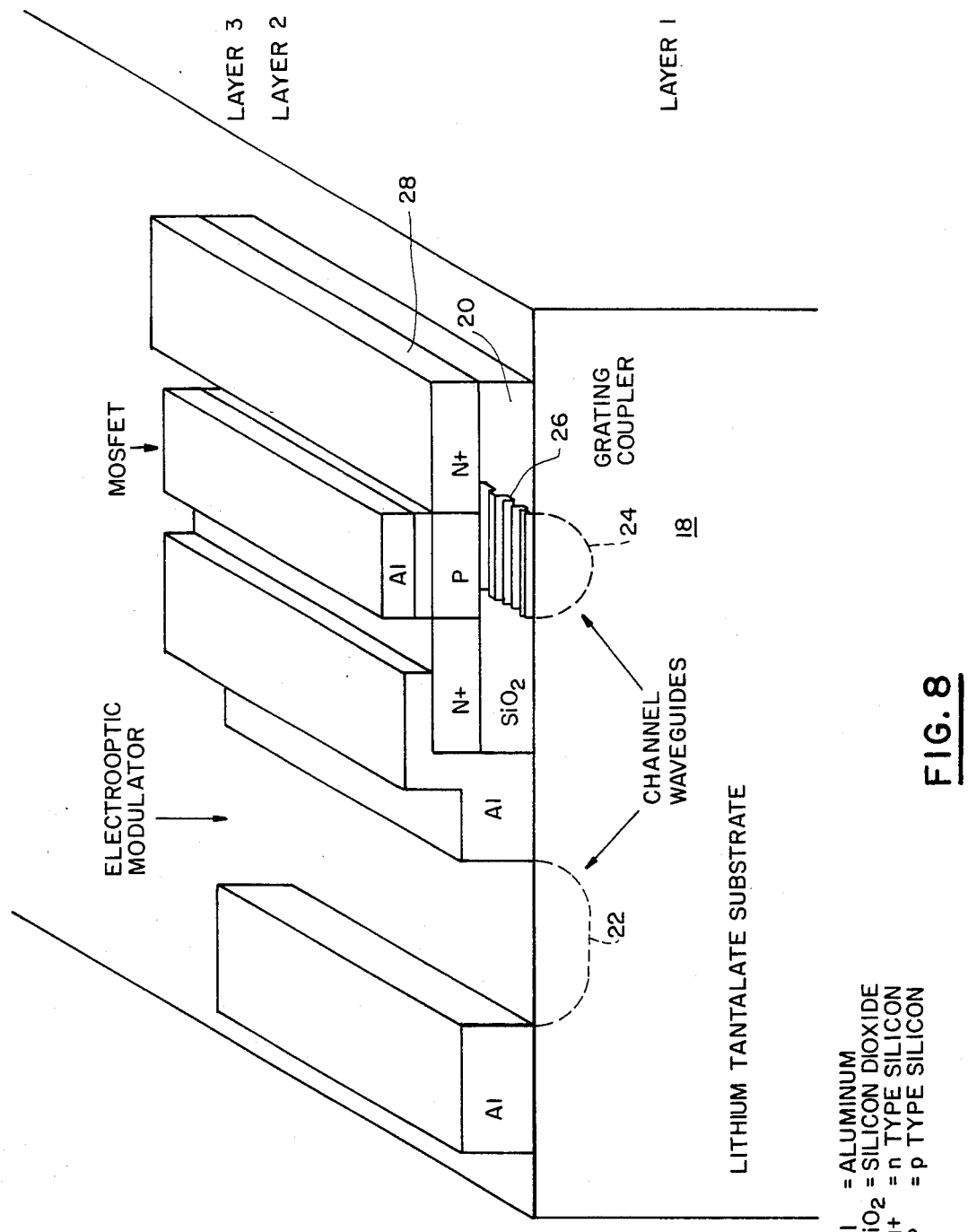
FIG. 8 is a schematic side view of a device shown, by way of example, and manufactured in accordance with the present invention. The device includes a MOSFET formed in a silicon layer on top of a silicon dioxide insulator which is deposited on an electrooptic lithium tantalate substrate having electrooptic devices formed in it.

Referring now to FIG. 8, the construction of a SOES electrooptic device will be described. The substrate material 18 is an electrooptic material such as lithium tantalate as described above. These material used for substrate 18 must have properties that permit use of focused laser light on layer 3 as illustrated in FIG. 8 to melt layer 3 without affecting the properties of the substrate 18. Lithium tantalate is such a material as it has a large electrooptic coefficient, is capable of withstanding relatively high optical energy, can be used to fabricate integrated electrooptic devices (as is described further below) and is able to withstand subsequent processing steps. The layer 18 must be thick enough to support the entire structure and typically several hundred micrometers would be sufficient.

The dielectric layer 2 is necessary to provide a buffer between layers 1 and 3. The buffer is necessary to prevent damage to layer 1 during the melting of layer 3 and to provide a diffusion barrier as discussed above for ions that might out diffuse from layer 1 and contaminate layer 3. This layer must be able to thermally insulate layer 1 from layer 3 as thermal strain in layer 1 could cause severe damage and destroy the structure. In the preferred embodiment of the present invention silicon dioxide is utilized for layer 2 as it is a very good thermal insulator, is stable at high temperatures, is a good diffusion barrier to lithium (which is an N-type doped in silicon, and will out diffuse lithium tantalate), is a transparent material, and is useful for photolithographic processes. The $SiO_2$ layer is deposited on the substrate 18 by well known techniques as would be readily appreciated by one of ordinary skill in this art. The thickness of the layer 20 of $SiO_2$ can be varied, with the minimum determined by the constraint not to damage the substrate 18 during the subsequent laser melting. For process parameters and materials described below, the layer 2 of SiO$_2$ 20 must be at least 8,000 Angstroms thick.

It should be noted at this point that prior to the deposition of the SiO$_2$ layer 20 the electrooptical devices desired to be formed in the substrate 18 are formed by well known processing techniques and need be discussed in no further detail here. By way of example, however, channel waveguide modulators 22 and 24 may be formed in the electrooptic substrate 18 as well as may be the optical grating coupler 26 as is well known.

Once the electrooptic devices have been formed in the substrate 18 and the silicon dioxide layer 20 has been deposited on the substrate 18, the semiconductor layer 20, layer 3 is formed on top of the transparent thermal insulator 20. The layer 28 consists of a thin (about 0.5 micrometers thick) film of silicon, in the preferred embodiment, in which electronic devices can be fabricated. It is to be understood at this point, as has been stated above, that other semiconductor materials such as germanium may be used provided they possess the proper characteristics. The silicon layer 28 must be of sufficient crystallographic quality to permit the fabrication of devices with high carrier mobility. This requires either single crystal silicon or large grain polycrystalline silicon. In accordance with the technique of the present invention of creating device quality silicon films, the silicon layer 28 which may be initially deposited as either amorphous or fine gain polycrystalline silicon is melted by means of a focused laser beam which is preferably an argon ion laser beam. Upon freezing, the silicon layer 28 recrystallizes into large grain polycrystalline material of sufficient quality to permit fabrication of high performance microelectronic circuitry in it. The scan speed and power of the focused laser beam utilized to melt the silicon layer 28 is crucial to proper operation of the invention since a too low power or too high scan speed will not melt the silicon film whereas a too high laser power will damage the electrooptic substrate 18.

As illustrated in FIG. 8, by way of example, the device fabricated in layer 3, the recrystallized silicon layer, is a metal-oxide-semiconductor field-effect transistor (MOSFET). The MOSFET is fabricated in the silicon layer 3 by means of standard processing techniques as would be readily understood by one of ordinary skill in this art. It is to be understood that other devices could be fabricated in the silicon layer, including a specially designed MOSFET that would function as a photodetector to detect light in waveguides in the lithium tantalate substrate.

The modulators 22 and 24 use the electrooptic effect of the substrate material 18 to alter the index of refraction in a channel waveguide. Properly designed, this can cause the waveguides 22 or 24 to no longer contain light, thereby modulating a light beam in the waveguide. In accordance with the present invention, the modulator 24 may be used to drive the electronic device illustrated in FIG. 8 as a MOSFET and, also, the MOSFET illustrated in FIG. 8 may be used to drive the optical channel waveguide 22. By varying the innerconnection scheme and cascading different modulators on the same waveguide, high speed logic functions can be performed and controlled entirely from within this single structure. It is noted at this point that the function of the grating coupler 26 is to deflect light from the channel waveguide 24 in the substrate 18 into the silicon film of layer 3 for detection and subsequent processing. If the silicon dioxide layer 20 is thin enough, i.e. approximately 1,000 Angstroms or less, this device would not be necessary as evanescent field coupling would then be sufficient.

Figure 6:
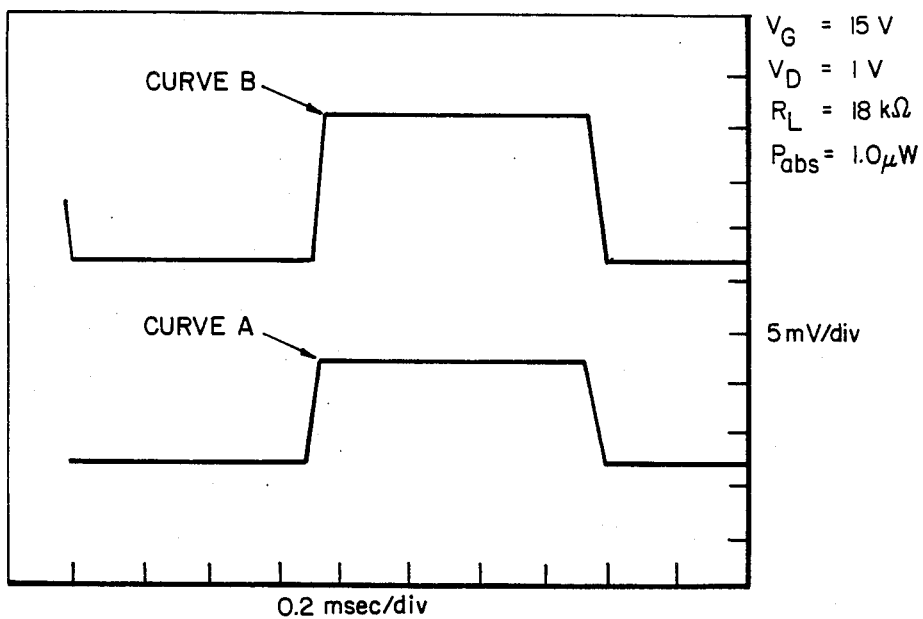
FIG. 6 is a graphic representation of the photoresponse induced by a laser beam on an NMOSFET in SOES.
Figure 7:
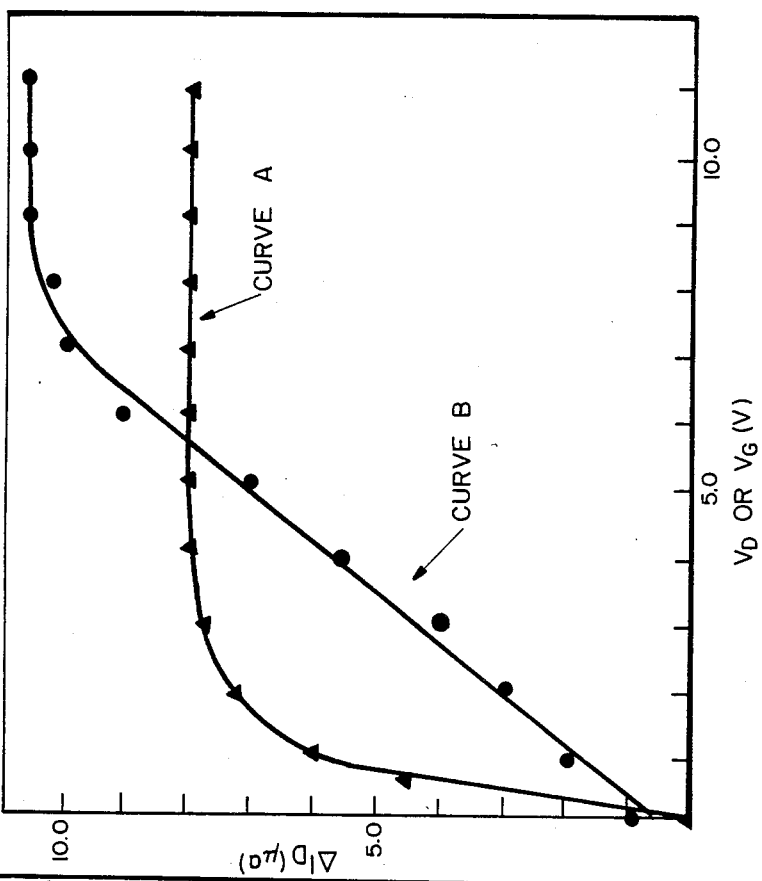
FIG. 7 is a graph of observed drain-source photocurrent of a transistor plotted vs. either gate voltage or drain voltage for a MOSFET manufactured in accordance with the present invention on an electrooptic substrate.

In accordance with the present invention a MOSFET was fabricated in a layer of silicon on silicon dioxide deposited on a lithium tantalate substrate. FIG. 6 shows the electrical output from this MOSFET when operated as a photodetector. A 1 mw HeNe laser was passed through a mechanical chopper and into a neutral density filter and then a beam splitter. One beam out of the beam splitter went into a silicon p-n junction photodetector and the other was transmitted onto the back side of the SOES transistor through an optical fiber. The transistor was placed on a substrate holder in which a hole had been drilled to allow the output end of the optical fiber to be placed at the back surface of the lithium substrate. Since the substrate was transparent, the transistor and the optical beam could be observed through a microscope simultaneously. Curve A shows the beamsplit portion of the incident laser beam while curve B of FIG. 6 shows the output of the SOES transistor at the drain with a load resistance of 18 kilohm and conditions as shown in the FIG. 6 caption. The photo current induced by the optical energy is the output voltage swing divided by the load resistance. In FIG. 7, the drain-source photo current, $\Delta I_D$, of a transistor with $V_T=3.5V$ is plotted vs. either $V_{D(curve\ A)}$ or $V_{G(curve\ B)}$ in FIG. 7 for a fixed input optical power.

It is emphasized that the laser melting step is the most critical step in the fabrication technique of the present invention. A set of parameters that has been used to fabricate devices in accordance with the present invention are as follows:

1. Laser power up to approximately 0.7 watts (all lines argon ion laser);
2. Focused beam spot size (diameter) of approximately 60 micrometers;
3. Laser beam scan velocity of 0.25 cm/sec;
4. Substrate temperature 425° C.;
5. Transparent thermal insulator layer thickness of at least 8,000 Angstroms, deposited by chemical vapor deposition at 700° C.; and
6. Semiconductor layer thickness of 5,000 Angstroms, deposited by chemical vapor deposition at 725° C.

It should be readily apparent to one of ordinary skill in this art that many potential variations of the parameters delineated above are possible within the light of the present teachings. The crucial point of the present invention is to use a combination of items 1 through 5 listed above so as to melt the semiconductor layer without damaging the electrooptic substrate layer thus resulting in recrystallization of the semiconductor layer into large grain polycrystalline or single crystal material.

In accordance with the present invention both electronic and optic signals can be handled on a single substrate. Thus, electronic and optic signal processing in an integrated device can be achieved by use of the present techniques.

Obviously many other modifications and variations of the present invention are possible in the light of the above teachings. It is therefore to be understood that within the scope of the appended claims the invention may be practiced otherwise than as specifically described.

What is claimed is:

1. A method of manufacturing an integrated electrooptical device comprising the steps of:
   (a) providing a substrate of electrooptic material said electrooptic material comprising lithium tantalate;
   (b) fabricating an optical device in said electrooptic substrate;
   (c) depositing a layer of transparent thermal insulator on a surface of said electrooptic substrate;
   (d) depositing layer of semiconductor material on said layer of transparent thermal insulator without damaging said electro-optic material, said semiconductor material comprising silicon;
   (e) applying a controlled energy beam to said layer of semiconductor material without damaging said electrooptic material and so as to melt said layer of semiconductor material and so as to cause the melted semiconductor material to recrystallize into large grain polycrystalline material;
   (f) fabricating a semiconductor device in said recrystallized large grain polycrystalline material.

2. The method of claim 1 wherein:
said step of providing an electrooptic substrate including providing an electrooptic substrate having at least one polished surface.

3. The method of claim 1 wherein step (b) comprises:
fabricating at least one optical waveguide in said electrooptic substrate.

4. The method of claim 1 wherein said step of fabricating a semiconductor device comprises the step of fabricating a transistor in said recrystallized large grain polycrystalline material.

5. The method of claim 1 wherein said transparent thermal insulator comprises silicon dioxide.

6. The method of claim 1 wherein said controlled energy beam comprises a laser beam.

7. The method of claim 6 wherein said laser beam comprises an argon ion laser beam.

8. The method of claim 1 further comprising step of:
following step (d) and before step (e), heating said substrate at approximately 875° C. in flowing nitrogen for approximately 30 minutes.

9. The method of claim 1 wherein:
step (e) is accomplished by subjecting said layer of semiconductor material that is deposited on said layer of transparent thermal insulator to a laser scan at the rate of approximately 0.25 to 0.5 cm/sec at a substrate temperature in the range of 425° C.

10. The method of claim 1 wherein:
said layer of semiconductor material comprises germanium.

11. The method of manufacturing an integrated electrooptical device comprising the steps of:
   (a) providing a substrate of electrooptic material comprising lithium tantalate;
   (b) fabricating an optical device in said electrooptic substrate;
   (c) depositing a layer of transparent thermal insulator on a surface of said electrooptic substrate;
   (d) depositing a layer of semiconductor material on said layer of transparent thermal insulator said semiconductor comprising germanium;
   (e) applying a controlled energy beam to said layer of semiconductor material without damaging said electrooptic material and so as to melt said layer of semiconductor material and so as to cause the melted semiconductor material to recrystallize into large grain polycrystalline material;
   (f) fabricating a semiconductor device in said recrystallized large grain polycrystalline material.

12. The method of claim 11 wherein said layer of semiconductor material comprises germanium.

13. A method of manufacturing an integrated electrooptical device comprising the steps of:
   (a) providing a substrate of electrooptic material comprising lithium niobate;
   (b) fabricating an optical device in said electrooptic substrate;
   (c) depositing a layer of transparent thermal insulator on a surface of said electrooptic substrate;
   (d) depositing a layer of semiconductor material on said layer of transparent thermal insulator said semiconductor material being selected from the group comprising silicon and germanium;
   (e) applying a controlled energy beam to said layer of semiconductor material without damaging said electrooptic material and so as to melt said layer of semiconductor material and so as to cause the melted semiconductor material to recrystallize into large grain polycrystalline material;
   (f) fabricating a semiconductor device in said recrystallized large grain polycrystalline material.

* * * * *